US012793761B2

(12) United States Patent
Lim

(10) Patent No.: US 12,793,761 B2
(45) Date of Patent: Nov. 10, 2026

(54) SEMICONDUCTOR MEMORY DEVICE AND SELF-REFRESH METHOD THEREOF

(71) Applicant: SAMSUNG ELECTRONICS CO., LTD., Suwon-si (KR)

(72) Inventor: Suk-Hyun Lim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 145 days.

(21) Appl. No.: 18/758,646

(22) Filed: Jun. 28, 2024

(65) Prior Publication Data

US 2025/0239290 A1 Jul. 24, 2025

(30) Foreign Application Priority Data

Jan. 18, 2024 (KR) ........................ 10-2024-0007817

(51) Int. Cl.

*G11C 11/406* (2006.01)
*G11C 11/4078* (2006.01)
*G11C 11/4096* (2006.01)

(52) U.S. Cl.

CPC .. *G11C 11/40615* (2013.01); *G11C 11/40622* (2013.01); *G11C 11/4078* (2013.01); *G11C 11/4096* (2013.01)

(58) Field of Classification Search

CPC .......................................... G11C 11/401–4099
See application file for complete search history.

(56) References Cited

U.S. PATENT DOCUMENTS

| | | | | |
|---|---|---|---|---|
| 10,636,476 | B2 | 4/2020 | Nale | |
| 11,100,973 | B2 | 8/2021 | Morgan | |
| 11,231,996 | B2 | 1/2022 | Chung et al. | |
| 2022/0051711 | A1* | 2/2022 | Ayyapureddi | G06F 7/58 |
| 2023/0162778 | A1 | 5/2023 | Ayyapureddi | |
| 2023/0298653 | A1 | 9/2023 | Kim et al. | |
| 2023/0343380 | A1 | 10/2023 | Sancon et al. | |
| 2023/0343381 | A1 | 10/2023 | Sancon et al. | |

* cited by examiner

*Primary Examiner* — Alfredo Bermudez Lozada
(74) *Attorney, Agent, or Firm* — Sughrue Mion, PLLC

(57) ABSTRACT

A self-refresh method of a semiconductor memory device including: receiving a self-refresh entry command; performing a self-refresh cycle based on the self-refresh entry command; receiving a self-refresh exit command; based on receiving the self-refresh exit command, determining a refresh operation status; and based on determining that the refresh operation status indicating an idle state, executing a care refresh operation corresponding to row-hammer care.

20 Claims, 11 Drawing Sheets

1280a

SEMICONDUCTOR MEMORY DEVICE AND SELF-REFRESH METHOD THEREOF

CROSS-REFERENCE TO RELATED APPLICATIONS

This application claims priority under 35 U.S.C. § 119 to Korean Patent Application No. 10-2024-0007817 filed on Jan. 18, 2024, in the Korean Intellectual Property Office, the disclosure of which is incorporated by reference herein in its entirety.

BACKGROUND

1. Field

The present disclosure relates to a semiconductor memory device, and more particularly, to a semiconductor memory device that performs a care refresh operation against a row-hammer attack and a self-refresh method thereof.

2. Description of Related Art

A semiconductor memory device, for example volatile memory device such as a dynamic random access memory (DRAM), may store data using charges stored in a capacitor. Because the charges stored in the capacitor may leak through various paths over time, DRAM may have finite data retention characteristics. In order to solve the issue of finite data retention, DRAM may use a refresh operation that periodically rewrites data stored in a capacitor.

Data writing to DRAM may be performed when the word line selected by the active operation is enabled. At this time, charge leakage may occur in memory cells of word lines adjacent to the activated word line. Because the data in the memory cell may be maintained by charges, if the charge leaks, the data in the memory cell may be lost. A row-hammer attack may be a type of security attack which may be attempted based on this phenomenon.

In order to prevent row-hammer attacks, memory cells that have leaked charge may be refreshed. For example, data restoration may be performed through refreshing of victim cells. This operation may be referred to as a care refresh operation. In order to perform the care refresh operation, the ongoing self-refresh cycle may be temporarily suspended. Additionally, a separate sequence or control operation may be performed to apply care refresh to the victim cells. This care refresh operation may reduce the efficiency of the ongoing self-refresh operation and may cause a decrease in refresh performance or speed.

SUMMARY

Provided is a semiconductor memory device and a self-refresh method thereof that may perform a care refresh operation, which is a defense against a row-hammer attack, without deteriorating self-refresh performance.

Additional aspects will be set forth in part in the description which follows and, in part, will be apparent from the description, or may be learned by practice of the presented embodiments.

In accordance with an aspect of the disclosure, a self-refresh method of a semiconductor memory device includes: receiving a self-refresh entry command; performing a self-refresh cycle based on the self-refresh entry command; receiving a self-refresh exit command; based on receiving the self-refresh exit command, determining a refresh operation status; and based on determining that the refresh operation status indicating an idle state, executing a care refresh operation corresponding to row-hammer care.

In accordance with an aspect of the disclosure, a semiconductor memory device includes: a cell array including a plurality of dynamic random access memory (DRAM) cells; a command decoder configured to decode commands received by the semiconductor memory device and to generate a self-refresh entry command and a self-refresh exit command; a care refresh control circuit configured to generate a care refresh control signal for performing a care refresh operation on victim cells based on the self-refresh entry command, the self-refresh exit command corresponding to selected memory cells, and a refresh operation status; and a refresh controller configured to perform a self-refresh operation on the selected memory cells and the care refresh operation on the victim cells based on receiving the care refresh control signal, wherein the care refresh control circuit is further configured to generate the care refresh control signal based on determining that the refresh operation status indicates an idle state, and to skip the care refresh operation based on determining that the refresh operation status indicates a refresh state.

In accordance with an aspect of the disclosure, a self-refresh method of a semiconductor memory device includes: performing a self-refresh cycle including a refresh state and an idle state as refresh operation status for the selected memory cells; receiving a self-refresh exit command; based on receiving the self-refresh exit command, determining a current refresh operation status; and executing a care refresh operation for row-hammer care based on the current refresh operation status.

BRIEF DESCRIPTION OF DRAWINGS

The above and other aspects, features, and advantages of certain embodiments of the present disclosure will be more apparent from the following description taken in conjunction with the accompanying drawings, in which.

DETAILED DESCRIPTION

Figure 1:
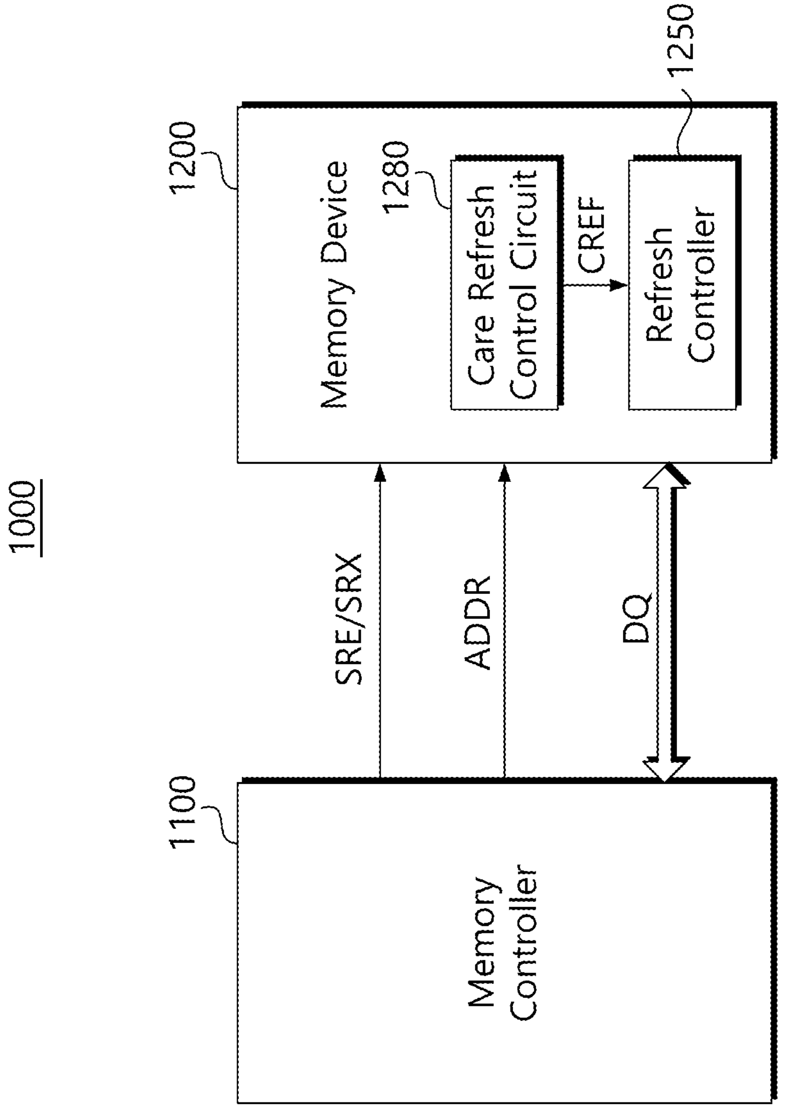
FIG. 1 is a block diagram showing a memory system according to an embodiment.

It is to be understood that both the foregoing general description and the following detailed description are intended to be exemplary. Reference signs referring to some embodiments of the disclosure are described herein and indicated in the drawings. Wherever possible, the same reference numbers are used in the description and drawings to refer to the same or like parts.

Hereinafter, examples described which relate to a semiconductor memory device including dynamic random access memory (DRAM) to explain examples the features and functions of some embodiments of the present disclosure. However, those skilled in the art will readily understand other advantages and capabilities of embodiments of the present disclosure based on what is described herein. Embodiments may be implemented or applied through other embodiments. Moreover, the detailed description may be modified or changed according to viewpoints and applications without significantly departing from the scope, technical spirit and other purposes of the present disclosure. In addition, the term "care refresh operation" used in this disclosure may refer to a refresh operation applied to victim cells as defense against row-hammer attacks.

FIG. 1 is a block diagram showing a memory system according to an embodiment. Referring to FIG. 1, the memory system 1000 may include a memory controller 1100 and a memory device 1200. The memory device 1200 may perform a care refresh operation for row-hammer care according to the self-refresh exit command SRX and the refresh operation status REF_Status.

The memory controller 1100 may perform an access operation to write data to the memory device 1200 or read data stored in the memory device 1200. Data exchange between the memory controller 1100 and the memory device 1200 may occur through a data channel DQ. The memory controller 1100 may generate a command CMD and an address ADDR for writing data to the memory device 1200 or reading data stored in the memory device 1200. The memory controller 1100 may be at least one of a memory controller for controlling the memory device 1200, a system-on-chip SoC such as an application processor AP, a CPU, and a GPU.

For example, the memory controller 1100 may issue refresh commands to control a refresh operation in the memory device 1200. For example, the memory controller 1100 may issue an all-bank refresh ABR command or a per-bank refresh PBR command. In addition, the memory controller 1100 may provide a self-refresh enter command SRE and the self-refresh exit command SRX to control a self-refresh operation to the memory device 1200. The self-refresh enter command SRE may be a command that instructs the start of a self-refresh operation, and the self-refresh exit command SRX may be a command that instructs the end of a self-refresh operation that has already been entered.

According to embodiments, the all-bank refresh ABR command may be a command to refresh all banks for the selected cell-row. Accordingly, because a refresh operation may occur in all memory banks, a read or write command to the memory banks being refreshed cannot be provided after an all-bank refresh ABR command is provided. In some embodiments, when a self-refresh entry command SRE is provided, an all-bank refresh ABR operation may be automatically initiated. In contrast, the per-bank refresh PBR command may be provided with an address that specifies one bank. Accordingly, during the per-bank refresh operation performed according to the per-bank refresh PBR command, reading and writing to the unselected bank may be possible.

In general, the memory controller 1100 may provide a self-refresh exit command SRX in order to provide another command after the self-refresh entry command SRE is provided. In a general case, the memory device 1200 may receive a new command after the self-refresh exit period tXSR has elapsed from a time point at which the self-refresh exit command SRX is received. However, according to embodiments, when the memory device 1200 receives a self-refresh exit command SRX, the memory device 1200 may perform a care refresh operation according to the refresh operation status. The care refresh operation may be sufficiently performed within the self-refresh exit time period tXSR. The self-refresh exit period tXSR is a value defined and guaranteed in the specifications of the memory device 1200. Therefore, when the care refresh operation according to embodiments is applied, no separate time or sequence is required for row-hammer care.

The memory device 1200 outputs read data requested by the memory controller 1100 to the memory controller 1100 or stores data requested to be written by the memory controller 1100 in a memory cell. For example, when the memory device 1200 according to embodiments receives a self-refresh exit command SRX during a refresh operation, the memory device 1200 may perform a care refresh operation according to the refresh operation status REF_Status of the memory cell selected for refresh. If the memory device 1200 is performing a refresh operation such as an active operation, a restore operation, and a precharge operation, the memory device 1200 may receive a self-refresh exit command SRX. The state in which the memory device 1200 performs a refresh operation may be referred to as a refresh state REF. In some embodiments, when the memory device 1200 receives the self-refresh exit command SRX in the refresh state REF, the self-refresh operation may be terminated after the self-refresh exit period tXSR has elapsed without executing the care refresh operation. However, the memory device 1200 may also receive a self-refresh exit command SRX in an idle state of a self-refresh operation. In this case, the memory device 1200 the care refresh operation may be executed, and then the self-refresh operation may be terminated.

The memory device 1200 may include a care refresh control circuit 1280 and a refresh controller 1250 for a care refresh operation according to the above-described refresh operation status REF_Status. The care refresh control circuit 1280 may start a self-refresh operation based on receiving a self-refresh entry command SRE. When receiving the self-refresh exit command SRX, the care refresh control circuit 1280 may determine whether to execute the care refresh operation according to the refresh operation status REF_Status.

The refresh operation status REF_Status indicates the operation status corresponding to the refresh cycle in which the self-refresh command is executed. For example, the refresh operation status REF_Status may include a refresh state REF and an idle state IDLE. The refresh state REF may indicate a section in which operations such as an active operation, a restore operation, and a precharge operation may be performed on the row selected for the self-refresh operation. The idle state IDLE may indicate a standby period for selecting the next row after the active operation, the restore operation, and the precharge operation for the selected row are completed. However, the refresh section tREF, which may be the duration of the refresh state REF, may be much shorter than the idle section tIDLE, which may be the duration of the idle state IDLE.

When the care refresh control circuit 1280 receives a self-refresh exit command SRX in the refresh state REF, the care refresh control circuit 1280 may end the self-refresh cycle without executing a care refresh operation. However, upon receiving the self-refresh exit command SRX in the idle state IDLE, the care refresh control circuit 1280 may terminate the self-refresh cycle after executing the care refresh operation.

The refresh controller 1250 may perform a refresh operation of the memory device 1200 according to various refresh commands. For example, the refresh controller 1250 may perform a care refresh operation on memory cells according to the care refresh control signal CREF generated by the care refresh control circuit 1280. For example, the refresh controller 1250 may perform a care refresh operation for row-hammer care according to the care refresh control signal CREF.

In embodiments, the memory device 1200 may be a high bandwidth memory HBM or a next-generation DRAM (e.g., a low-power double data rate (LPDDR) device such LPDDR6 or LPDDR7) that operates at very high speed. The memory device 1200 may be a semiconductor memory device within a system-in-package (SiP). In some embodiments, the memory device 1200 may include double data rate (DDR) synchronous dynamic random access memory (SDRAM), LPDDR-SDRAM, Graphics double data rate (GDDR)-SDRAM, rambus dynamic random access memory (RDRAM), and static random access memory (SRAM). In some embodiments, the memory device 1200 may be a non-volatile memory device such as resistive RAM (RRAM), phase change memory PRAM, magnetoresistive memory MRAM, ferroelectric memory FRAM, spin injection magnetization reversal memory, and spin-transfer torque (STT-RAM). Although examples are described herein based on DRAM, embodiments are not limited thereto.

As described above, in the memory device 1200 according to embodiments, when a self-refresh exit command SRX is received during a refresh operation, the care refresh operation may be performed or skipped depending on the refresh operation status REF_Status. Therefore, row-hammer care may be possible in the memory device 1200 without deteriorating the performance of the self-refresh operation. When a self-refresh exit command SRX is received in the idle state IDLE of a self-refresh cycle, the self-refresh exit period tXSR may be guaranteed. Therefore, it may be possible to perform the care refresh operation sufficiently within the self-refresh exit period tXSR.

Figure 2:
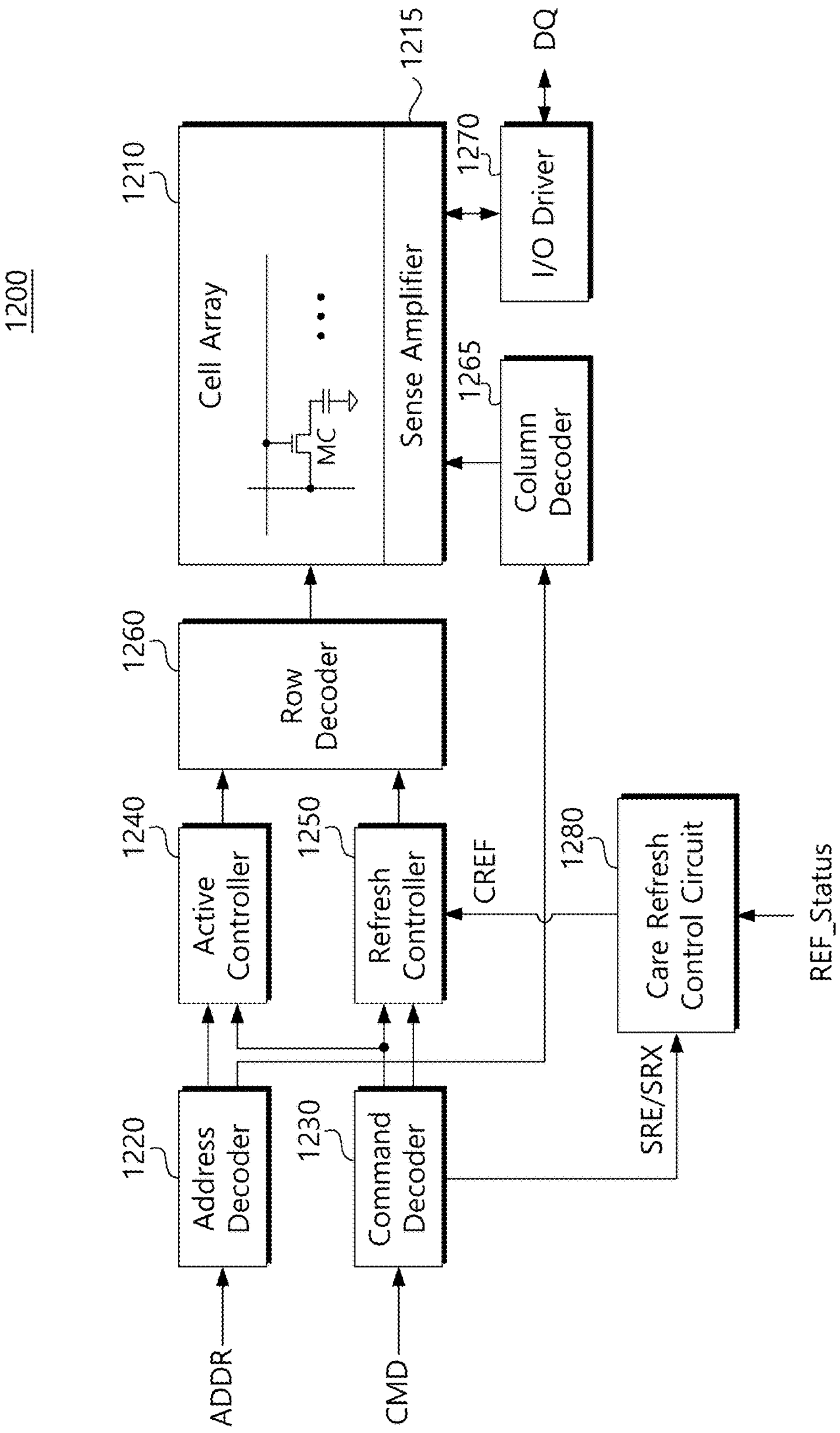
FIG. 2 is a block diagram showing a memory device according to an embodiment.

FIG. 2 is a block diagram showing a memory device according to an embodiment. Referring to FIG. 2, the memory device 1200 may include a cell array 1210, a sense amplifier 1215, an address decoder 1220, a command decoder 1230, an active controller 1240, a refresh controller 1250, and a row decoder 1260, a column decoder 1265, an input/output driver 1270, and a care refresh control circuit 1280.

The cell array 1210 may include a plurality of memory cells MC. Data stored in the memory cells MC may be provided to the input/output driver 1270 through the sense amplifier 1215. In some embodiments, write data received from the input/output driver 1270 may be stored in the selected memory cell through the sense amplifier 1215. At this time, the column decoder 1265 and the row decoder 1260 may select a memory cell corresponding to the address ADDR.

The address decoder 1220 may receive the address ADDR of the memory cell being accessed. When data is stored in the cell array 1210 or is read from the cell array 1210, the address ADDR may be received and decoded in the address decoder 1220. The decoded address may be delivered to the active controller 1240, row decoder 1260, and column decoder 1265. The row decoder 1260 and column decoder 1265 select the row and column specified by the address ADDR.

The command decoder 1230 may receive various commands input through a command/address CA line. The command decoder 1230 may decode and provide commands to circuit blocks such as the column decoder 1265, the active controller 1240, and the refresh controller 1250. The command decoder 1230 may determine the input command by referring to externally applied control signals (e.g., a row address strobe signal/RAS, a column address strobe signal/CAS, and a write enable signal/WE). In some embodiments, the command decoder 1230 may write data to a mode register set (MRS) according to an externally provided command and address. For example, a general auto refresh operation may be input through a combination of control signals (e.g., the row address strobe signal/RAS, the column address strobe signal/CAS, and the write enable signal/WE). The self-refresh command may be decoded by the command decoder 1230, and the decoded self-refresh command may be provided to the refresh controller 1250. For example, the command decoder 1230 may transmit the self-refresh entry command SRE and self-refresh exit command SRX, which may be the results of decoding the input command, to the care refresh control circuit 1280.

The active controller 1240 may generate an active address and an active signal ACT for a write or read operation using an address ADDR and a command CMD and may provide them to the row decoder 1260.

When a refresh command is input to the memory device 1200, the refresh controller 1250 may perform a refresh operation corresponding to the command. For example, when an all-bank refresh ABR command is received, the refresh controller 1250 may refresh all memory banks corresponding to the selected row. When a per-bank refresh PBR command is received, the refresh controller 1250 may perform a refresh operation on a bank selected through a bank address among a plurality of memory banks.

In addition, the refresh controller 1250 may generate an internal address for refresh during a self-refresh operation and perform a refresh operation on memory cells selected by the internal address. Additionally, the refresh controller 1250 may initiate the requested self-refresh operation when receiving the self-refresh entry command SRE. And when the refresh controller 1250 receives the self-refresh exit command SRX, the refresh controller 1250 may end the currently executing self-refresh operation. For example, the refresh controller 1250 may perform a care refresh operation according to the care refresh control signal CREF provided from the care refresh control circuit 1280.

The row decoder 1260 may control the operation of the cell array 1210 through the provided active address, active signal, refresh active signal, and refresh address. During a self-refresh cycle, the row decoder 1260 may activate the cell-row selected by the refresh controller 1250. The row decoder 1260 may activate the cell-row of the selected bank during the self-refresh operation.

The input/output driver 1270 may receive data provided through a data pad DQ and provide it to the sense amplifier 1215. The input/output driver 1270 may output data stored in the cell array 1210 through the data pad DQ. In some embodiments, the input/output driver 1270 may receive a data strobe signal DQS when receiving data. Additionally, the input/output driver 1270 may output data using a data strobe signal DQS.

When receiving the self-refresh exit command SRX, the care refresh control circuit 1280 may determine whether to execute the care refresh operation according to the refresh operation status REF_Status. For example, when the care refresh control circuit 1280 receives the self-refresh exit command SRX during the refresh state REF of a self-refresh operation, the care refresh control circuit 1280 may end the self-refresh cycle without a care refresh operation. However, when the care refresh control circuit 1280 receives a self-refresh exit command SRX in the idle state IDLE, the care refresh control circuit 1280 may terminate the self-refresh cycle after executing the care refresh operation.

An exemplary structure of the memory device 1200 according to embodiments is described above. The memory device 1200 according to embodiments may determine whether to execute a care refresh operation based on the refresh operation status REF_Status in response to the self-refresh exit command SRX. When a self-refresh exit command SRX is received in the idle period tIDLE of the self-refresh cycle of the memory device 1200, a care refresh operation may be executed in the self-refresh exit period tXSR. Because the self-refresh exit period tXSR may be guaranteed to occur in the memory device 1200, the care refresh operation may be sufficiently performed within the self-refresh exit period tXSR. Accordingly, the care refresh operation may be performed while being hidden in the normal self-refresh operation rather than in a separate section or sequence. As a result, in the memory device 1200 according to embodiments, a care refresh operation may be performed without deteriorating the performance of the refresh operation or increasing the power required for row-hammer care.

Figure 3:
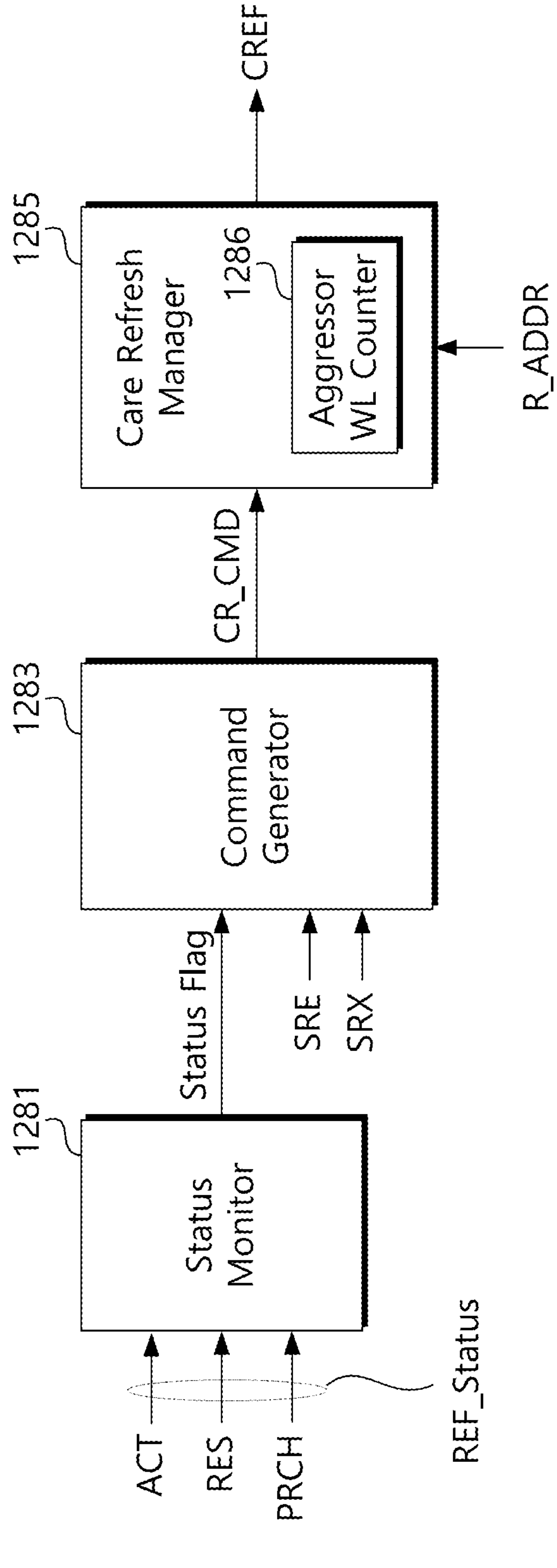
FIG. 3 is a block diagram showing an embodiment of the care refresh control circuit of FIG. 2, according to an embodiment.

FIG. 3 is a block diagram showing an embodiment of the care refresh control circuit of FIG. 2. For example, in some embodiments, the care refresh control circuit 1280*a* of FIG. 3 may correspond to the care refresh control circuit 1280 of FIG. 2, but embodiments are not limited thereto. Referring to FIG. 3, the care refresh control circuit 1280*a* according to embodiments may include a status monitor 1281, a command generator 1283, and a care refresh manager 1285.

The status monitor 1281 may monitor the current refresh operation status REF_Status of the memory device 1200. The status monitor 1281 may check the refresh operation status REF_Status of the memory device 1200 from the reception of the self-refresh entry command SRE for the refresh operation until the self-refresh exit command SRX is received to generate the status flag Status Flag. For example, the status monitor 1281 may determine the refresh operation status REF_Status by monitoring the active signal ACT, restore signal RES, and precharge signal PRCH which may be activated for the refresh operation. If at least one of the active signal ACT, the restore signal RES, and the precharge signal PRCH is activated, the status monitor 1281 may determine the refresh operation status REF_Status to be active. At this time, the status monitor 1281 may output the status flag at a high level (e.g., "H"). However, if the active signal ACT, restore signal RES, and precharge signal PRCH are all in an inactive state, the status monitor 1281 may determine that the refresh operation status REF_Status is in an inactive state. At this time, the status monitor 1281 may output the status flag at a low level (e.g., "L").

The command generator 1283 may generate a care refresh command CR_CMD based on the self-refresh exit command SRX and the status flag provided from the status monitor 1281. For example, the command generator 1283 may block the generation of the care refresh command CR_CMD even if the self-refresh exit command SRX is provided when the status flag Status Flag is at a high level. However, the command generator 1283 may output a care refresh command CR_CMD when the self-refresh exit command SRX is provided while the status flag Status Flag is at a low level. For example, when the refresh operation status REF_Status is in the idle state IDLE, the command generator 1283 may output the care refresh command CR_CMD in response to the self-refresh exit command SRX.

The care refresh manager 1285 may determine whether to execute the care refresh command CR_CMD according to the aggressor word line count AGG_WL_CNT. For example, the care refresh manager 1285 may monitor row-hammer attacks. As a result of the monitoring, if it is determined that a specific word line is exposed to a row-hammer attack, the care refresh manager 1285 may output a care refresh control signal CREF. The care refresh control signal CREF may activate the care refresh operation for the victim word line exposed to the row-hammer attack.

The care refresh manager 1285 may include an aggressor word line counter 1286 to monitor for row-hammer attacks. The aggressor word line counter 1286 may monitor the input row address R_ADDR to determine whether the number of accesses to a specific word line is greater than a threshold. If access to a specific word line exceeds the threshold TH, the care refresh manager 1285 may determine that a row-hammer attack is occurring or has occurred, and may activate the care refresh control signal CREF. However, monitoring of row-hammer attacks is not limited to the methods described above. It will be appreciated that row-hammer attacks may be identified using various algorithms or detection methods.

An example of the care refresh control circuit 1280*a* according to an embodiment is briefly described above. The care refresh control circuit 1280*a* may determine whether to execute the care refresh operation according to the refresh operation status REF_Status at the time the self-refresh exit command SRX is input. For example, when a self-refresh exit command SRX is received in the refresh state REF of the self-refresh operation of the memory device 1200, the self-refresh operation may be terminated after the self-refresh exit period tXSR without executing the care refresh operation. In contrast, if the self-refresh exit command SRX is received in the idle state IDLE of the self-refresh operation of the memory device 1200, the self-refresh operation may be terminated after execution of the care refresh operation.

Figure 4:
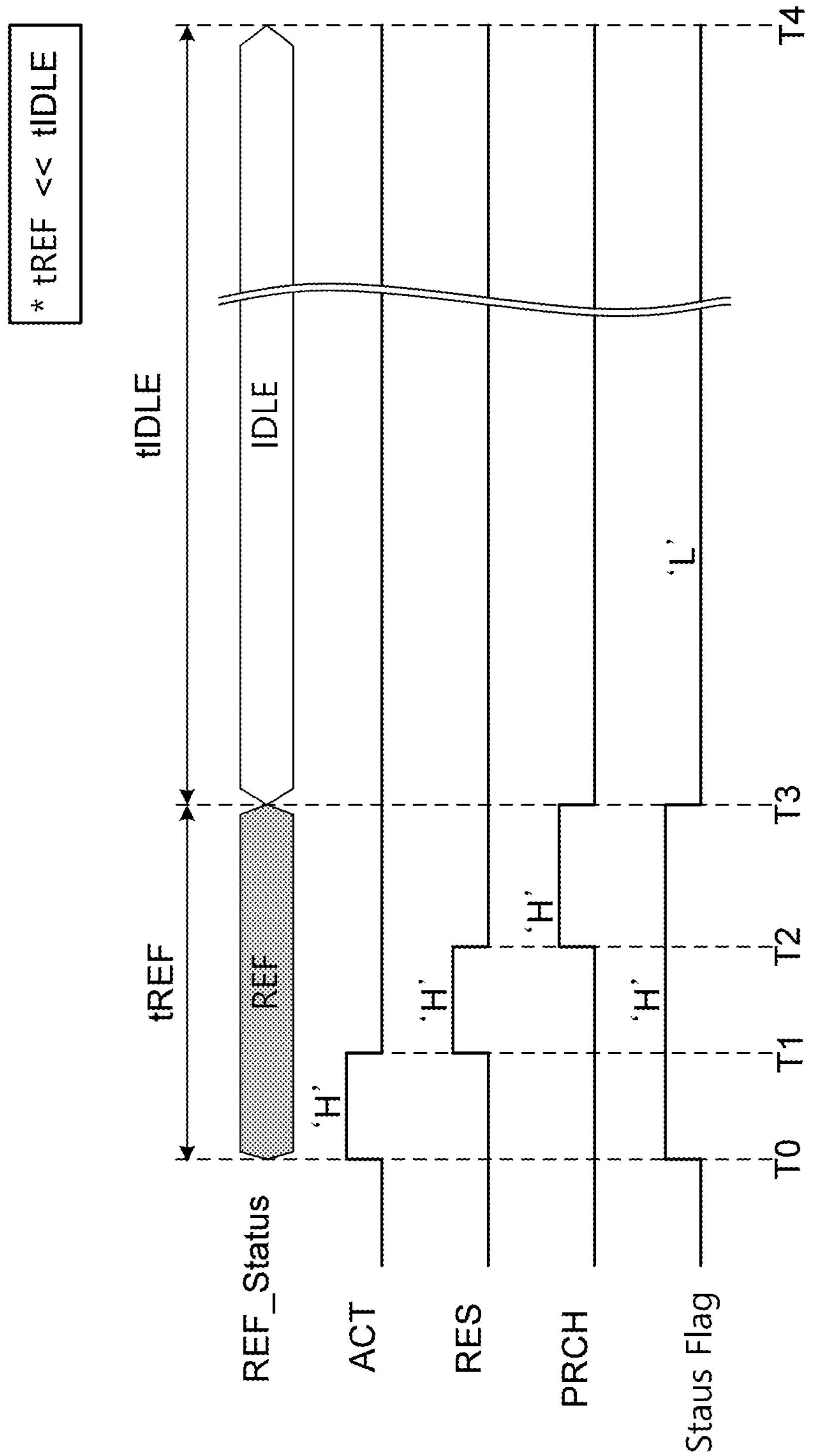
FIG. 4 is a timing diagram showing the operation of the status monitor of FIG. 3, according to an embodiment.

FIG. 4 is a timing diagram showing the operation of the status monitor of FIG. 3. Referring to FIG. 4, the status monitor 1281 may generate a status flag Status Flag according to the refresh operation status REF_Status.

The status monitor 1281 may receive signals for determining the refresh operation status REF_Status. The refresh operation status REF_Status may be substantially divided into a refresh state REF in which at least one of active, restore, and precharge operations for the word line is executed, and an idle state IDLE in which may be a standby state. The status monitor 1281 may receive the active signal ACT, restore signal RES, and precharge signal PRCH of the word line that are activated during the refresh operation. Generally, to execute a refresh operation, a word line may be activated, a restore operation may be activated, and then a precharge operation may be performed.

For example, at TO, the active signal ACT may be activated to the high level "H". Next, the restore signal RES may be activated at T1, and the precharge signal PRCH may be activated at T2. At T3, the active signal ACT, restore signal RES, and precharge signal PRCH may all be deactivated to low level "L". For example, the refresh for the selected row may be completed and maintained in the idle state IDLE corresponding to the standby state. Here, the level transitions of the active signal ACT, restore signal RES, and precharge signal PRCH are merely examples. For example, activation of the active signal ACT may be extended to the time point T2 or T3.

The refresh operation status REF_Status may indicate the status of the refresh cycle for one row refresh operation. A refresh cycle may include a refresh state REF in which a refresh operation is performed in a substantially selected row, and an idle state IDLE corresponding to a standby state. The refresh state REF may be be maintained during the refresh period tREF, and the idle state IDLE may be be maintained during the idle period tIDLE. However, in some implementations, in one refresh cycle, the refresh period tREF may be much shorter than the idle period tIDLE. For example, in a specific DRAM device, the refresh period tREF may be about 300 nanoseconds (ns), while the idle period tIDLE may be set and managed at about 3.6 microseconds (μs).

Based on the above-described refresh operation status REF_Status, the status monitor 1281 according to embodiments may generate a status flag Status Flag. Then, the care refresh control circuit 1280*a* may perform a care refresh operation when a self-refresh exit command SRX is provided in the idle period tIDLE based on the status flag. Thereafter, the care refresh control circuit 1280*a* may receive another command after the care refresh operation ends. The idle interval tIDLE may be long enough to cover the time during which the care refresh operation is performed (e.g., tRFCab).

Figure 5:
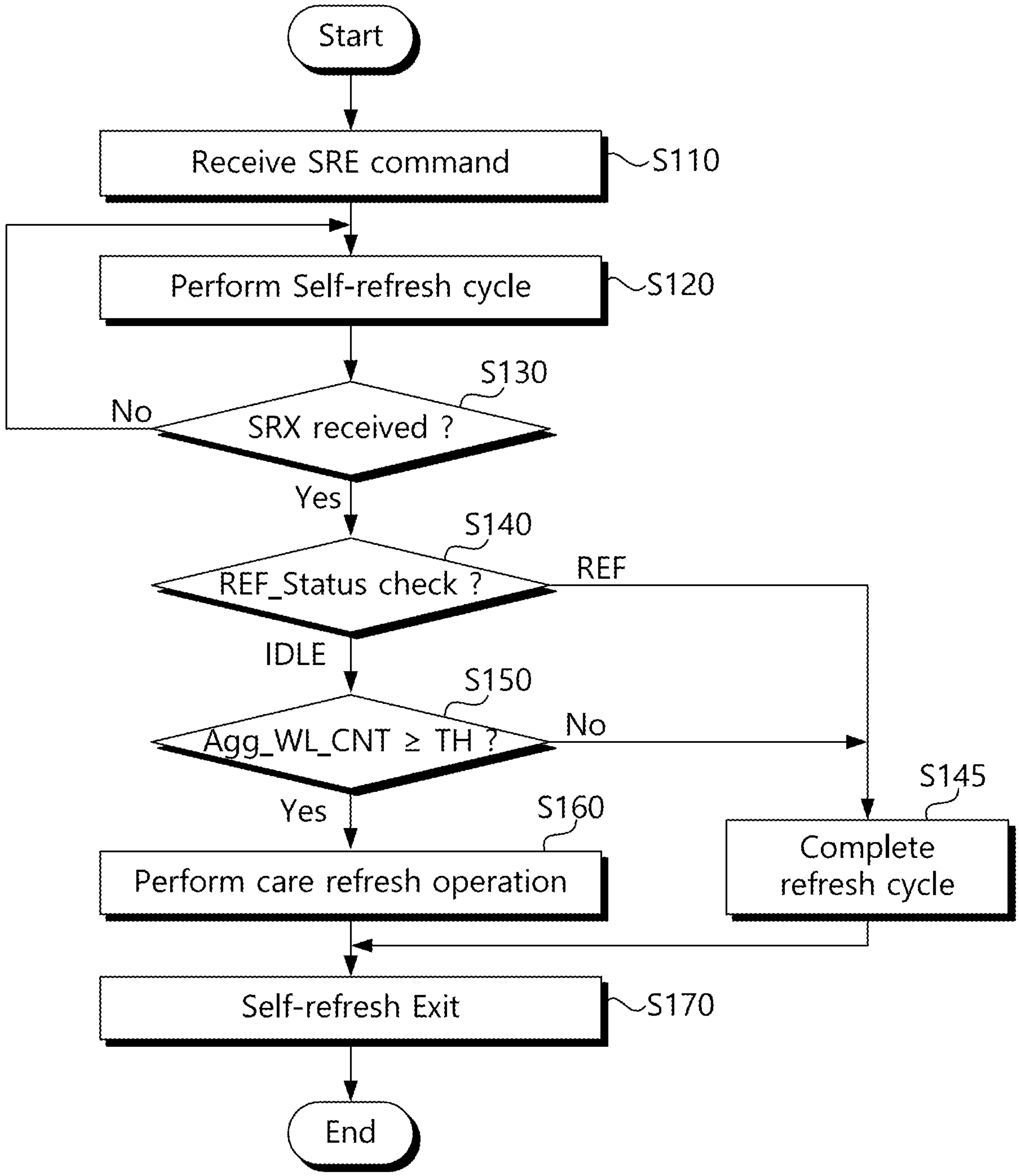
FIG. 5 is a flowchart showing a care refresh operation according to an embodiment.

FIG. 5 is a flowchart showing a care refresh operation according to an embodiment. Referring to FIG. 5, the care refresh control circuit 1280*a* and the refresh controller 1250 of FIG. 3 may monitor the self-refresh exit command SRX and refresh operation status REF_Status after receiving the self-refresh entry command SRE. Additionally, the care refresh control circuit 1280*a* may determine whether to execute a care refresh operation for row-hammer care according to the monitoring result.

At operation S110, the care refresh control circuit 1280*a* may receive a self-refresh entry command SRE provided from the outside. The self-refresh entry command SRE may be decoded by the command decoder 1230 (as shown for example in FIG. 2) and then provided to the care refresh control circuit 1280*a*.

At operation S120, the care refresh control circuit 1280*a* and the refresh controller 1250 may start a self-refresh cycle according to the self-refresh entry command SRE. As described in FIG. 4, the self-refresh cycle may include a refresh period tREF and an idle period tIDLE. A self-refresh cycle may be applied to all selected row units.

At operation S130, the care refresh control circuit 1280*a* may detect whether the self-refresh exit command SRX following the self-refresh entry command SRE is received. If reception of the self-refresh exit command SRX is detected ("Yes" at operation S130), the procedure may proceed to operation S140. However, if the self-refresh exit command SRX is not detected ("No" at operation S130), the procedure may return to step S120 and continue execution of the self-refresh cycle (e.g., refresh and idle).

At operation S140, the care refresh control circuit 1280*a* may check the refresh operation status REF_Status at the time the self-refresh exit command SRX is received. If the refresh operation status REF_Status corresponds to or indicates the refresh status REF ("REF" at operation S140), the procedure may proceed to operation S145. In contrast, if the refresh operation status REF_Status indicates an idle state IDLE ("IDLE" at operation S140), the procedure may proceed to step S150.

At operation S145, the care refresh control circuit 1280*a* may perform and complete the refresh operation in progress at the time the self-refresh exit command SRX is received. For example, the care refresh control circuit 1280*a* may skip execution of the care refresh operation by deactivating the care refresh control signal CREF. According to embodiments, the refresh operation status REF_Status of the memory device 1200 may continue to the idle state IDLE when the refresh state REF ends. Then, when the refresh escape time tXSR elapses, the procedure may proceed to operation S170, where the self-refresh cycle may end and another command may be received.

At operation S150, the care refresh control circuit 1280*a* may check for the occurrence of a row-hammer attack. For example, the aggressor word line counter 1286 of the care refresh manager 1285 may check whether the aggressor word line count AGG_WL_CNT has reached a threshold TH. If the aggressor word line count AGG_WL_CNT is less than the threshold TH ("No" at operation S150), the procedure may proceed to operation S145. However, if the aggressor word line count AGG_WL_CNT is greater than or equal to the threshold TH ("Yes" at operation S150), the procedure may proceed to operation S160.

At operation S160, the care refresh control circuit 1280*a* may activate the care refresh control signal CREF. Then, the refresh controller 1250 may execute a care refresh operation in response to the care refresh control signal CREF. According to the care refresh operation, refresh may occur for the victim cells of the row-hammer attack. The care refresh operation may be completed within the idle period tIDLE.

At operation S170, the care refresh control circuit 1280*a* may end the self-refresh operation requested through the self-refresh entry command SRE. Then, it may become possible to input another command synchronized with the self-refresh exit command SRX.

Examples of functions of the care refresh control circuit 1280*a* and the refresh controller 1250 according to embodiments are briefly described above. According to embodiments, the care refresh control circuit 1280*a* may determine whether to execute the care refresh operation according to the refresh operation status REF_Status at the time the self-refresh exit command SRX is received. Accordingly, the refresh operation for row-hammer care may be performed in the idle state IDLE without any additional time required for the care refresh operation.

Figure 6:
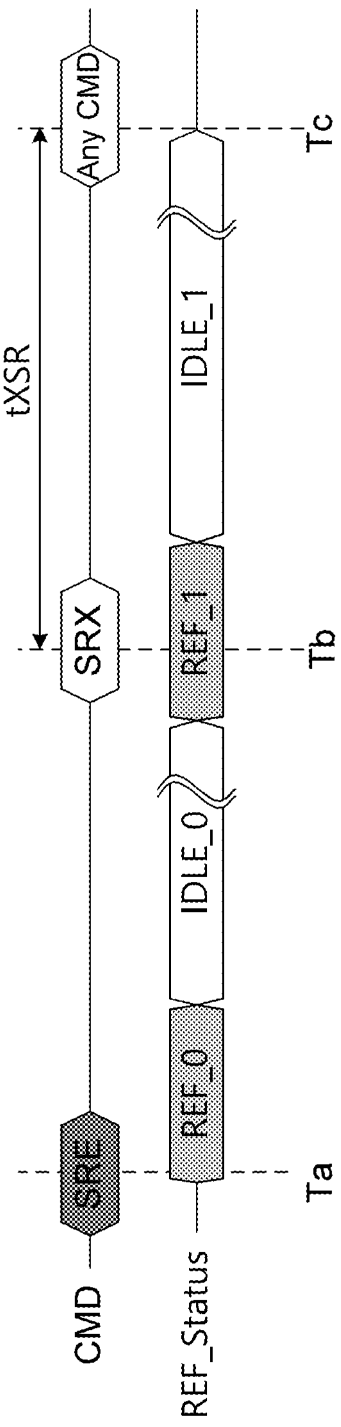
FIG. 6 is a timing diagram showing the refresh operation of FIG. 5, according to an embodiment.

FIG. 6 is a timing diagram showing the refresh operation of FIG. 5. Referring to FIG. 5 and FIG. 6, when the time point at which the self-refresh exit command SRX corresponds to the refresh state REF of the memory device 1200, the care refresh operation may be skipped.

At Ta, a self-refresh entry command SRE may be received from outside the memory device 1200. Then, the refresh controller 1250 or the care refresh control circuit 1280*a* may start a self-refresh cycle. For example, the refresh controller 1250 may execute the first refresh cycle (REF_0, IDLE_0) for the selected row. Subsequently, the refresh controller 1250 will execute the second refresh cycle (REF_1, IDLE_1) for the next row (e.g., an incremented row).

At Tb, a self-refresh exit command SRX may be received. Then, the care refresh control circuit 1280*a* may check the refresh operation status REF_Status at the time point at which the self-refresh exit command SRX is received. The refresh operation status REF_Status at Tb may indicate the refresh state REF_1. Accordingly, the care refresh control circuit 1280*a* may complete the refresh operation which is ongoing at the time point self-refresh exit command SRX is received without executing the care refresh operation. For example, the care refresh control circuit 1280*a* may skip execution of the care refresh operation by deactivating the care refresh control signal CREF. Then, the care refresh control circuit 1280*a* may exit the refresh operation mode after the self-refresh exit period tXSR. At a time Tc when the self-refresh exit period tXSR has elapsed from the time point of reception of the self-refresh exit command SRX, reception of another command Any CMD becomes possible.

An example of the operation of the care refresh control circuit 1280*a* when the self-refresh exit command SRX is received at the refresh state REF_1 is described above. When the reception of the self-refresh exit command SRX corresponds to the refresh state REF_i in which operations such as active ACT, restore RES, and precharge PRCH are performed, the care refresh control circuit 1280*a* may exit the refresh operation mode without executing the care refresh operation.

Figure 7:
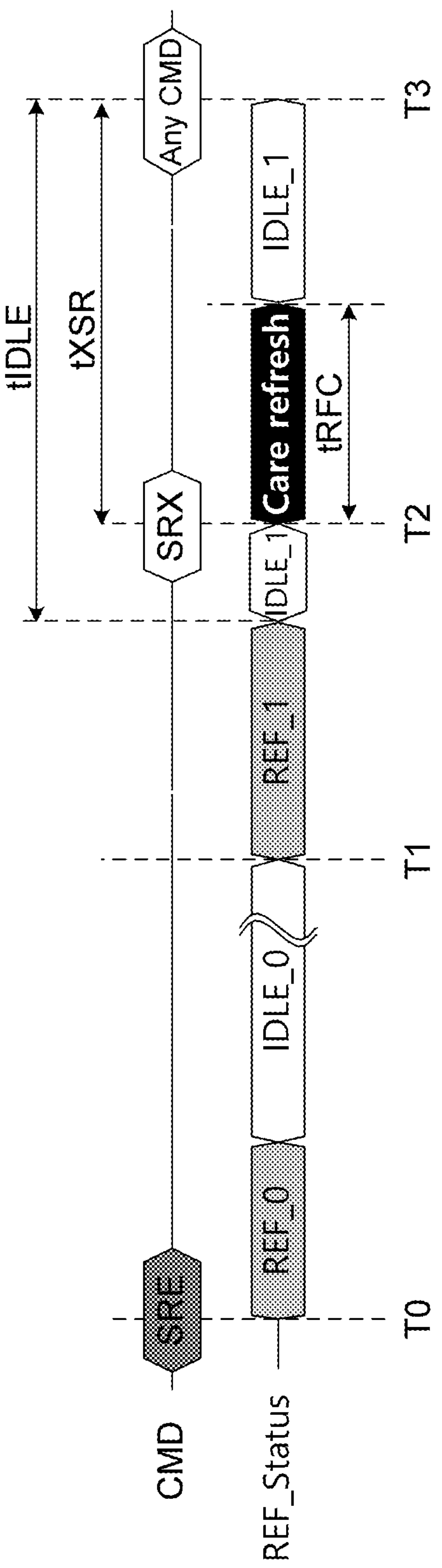
FIG. 7 is a timing diagram showing another example of the refresh operation of FIG. 5, according to an embodiment.

FIG. 7 is a timing diagram showing another example of the refresh operation of FIG. 5. Referring to FIG. 5 and FIG. 7, when the time point at which the self-refresh exit command SRX is received corresponds to the idle state IDLE, the self-refresh operation may be exited after execution of the care refresh operation.

At T0, a self-refresh entry command SRE may be input to the memory device 1200. Then, the refresh controller 1250 or the care refresh control circuit 1280*a* may start a self-refresh cycle. For example, the refresh controller 1250 may execute the first refresh cycle (REF_0, IDLE_0) for the selected row. Subsequently, at T1, the refresh controller 1250 may start the second refresh cycle (REF_1, IDLE_1) for the next row (e.g., an incremented row).

At T2, a self-refresh exit command SRX may be received. Then, the care refresh control circuit 1280*a* may the refresh operation status REF_Status at the time point at which the self-refresh exit command SRX is received. The refresh operation status REF_Status at T2 may indicate the idle status IDLE_1. Accordingly, the care refresh control circuit 1280*a* may execute the care refresh operation at T2. The care refresh operation may be performed during a general refresh period tRFC. The refresh period tRFC in which the care refresh operation is performed may be much shorter than the idle period tIDLE. Accordingly, the execution time of the care refresh operation may be sufficiently guaranteed from the time point at which the self-refresh exit command SRX is received until the self-refresh exit period tXSR elapses.

At T3, the refresh operation mode may be terminated because the self-refresh exit period tXSR has elapsed from the time point at which the self-refresh exit command SRX is received. After this, another command (e.g., Any CMD) may be received.

An example of the operation of the care refresh control circuit 1280*a* when the self-refresh exit command SRX is received at the idle state IDLE_1 is described above. When the self-refresh exit command SRX is received in the idle state IDLE, the care refresh control circuit 1280*a* may exit the self-refresh operation mode after performing the care refresh operation.

Figure 8:
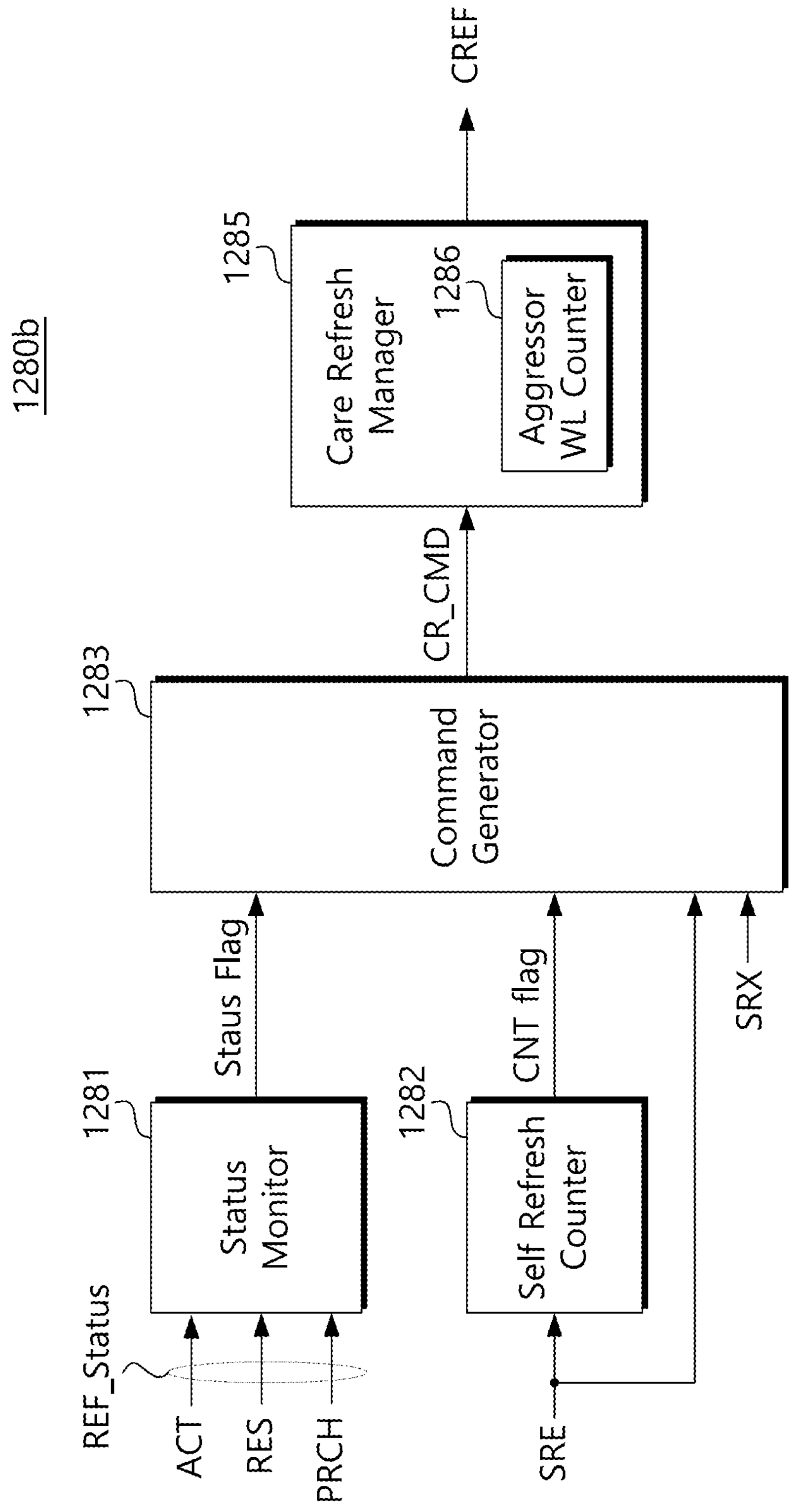
FIG. 8 is a block diagram showing another embodiment of the care refresh control circuit of FIG. 2, according to an embodiment.

FIG. 8 is a block diagram showing another embodiment of the care refresh control circuit of FIG. 2. For example, in some embodiments, the care refresh control circuit 1280*b* of FIG. 8 may correspond to the care refresh control circuit 1280 of FIG. 2, but embodiments are not limited thereto. Referring to FIG. 8, the care refresh control circuit 1280*b* embodiments may include a status monitor 1281, a self-refresh counter 1282, a command generator 1283, and a care refresh manager 1285.

The status monitor 1281 may monitor the current refresh operation status REF_Status of the memory device 1200. The status monitor 1281 may check the refresh operation status REF_Status of the memory device 1200 and may generate a status flag. The status monitor 1281 may determine the refresh operation status REF_Status by monitoring an active signal ACT, restore signal RES, and precharge signal PRCH activated for the refresh operation. When at least one of the active signal ACT, restore signal RES, and precharge signal PRCH for the refresh operation is activated, the status monitor 1281 may set the status flag to high level (e.g., "H"). However, if the active signal ACT, restore signal RES, and precharge signal PRCH are all inactive, the status monitor 1281 outputs the status flag at low level (e.g., "L").

The self-refresh counter 1282 may count the number of refreshes, refresh count SR_CNT that occur continuously by a self-refresh command. For example, the self-refresh counter 1282 may count the number of self-refresh entry commands SREs used to perform one self-refresh command and may output the number as a count flag CNT flag. The self-refresh counter 1282 may use the number of self-refresh entry commands SRE as the refresh count SR_CNT. The self-refresh counter 1282 may output a count flag CNT flag when the refresh count SR_CNT exceeds the reference value "n".

The command generator 1283 may generate a care refresh command CR_CMD based on the self-refresh exit command SRX, the status flag Status Flag provided from the status monitor 1281, and the count flag CNT flag from the self-refresh counter 1282. The command generator 1283 may receive the self-refresh exit command SRX when the status flag Status Flag is at a high level indicating the refresh status REF. At this time, the command generator 1283 may block generation of the care refresh command CR_CMD regardless of the count flag CNT flag. However, the command generator 1283 may receive a self-refresh exit command SRX when the status flag is at a low level. Then, the command generator 1283 may check whether the count flag CNT flag is at a high level and output a care refresh command CR_CMD according to the check result. For example, the command generator 1283 may issue a care refresh command CR_CMD in response to the self-refresh exit command SRX only when the refresh operation status REF_Status is in the idle state IDLE and the refresh count SR_CNT is greater than or equal to the reference value "n".

The care refresh manager 1285 may determine whether to execute the care refresh command CR_CMD according to the aggressor word line count AGG_WL_CNT. For example, the care refresh manager 1285 may monitor row-hammer attacks. As a result of the monitoring, if it is determined that a specific word line is exposed to the row-hammer attack, the care refresh manager 1285 may output a care refresh control signal CREF. The care refresh control signal CREF may activate the care refresh operation for the victim word line exposed to the row-hammer attack.

The care refresh manager 1285 may include an aggressor word line counter 1286 to monitor for row-hammer attacks. The aggressor word line counter 1286 may monitor the input row address R_ADDR to determine whether the number of accesses to a specific word line is greater than the threshold TH. If access to a specific word line exceeds the threshold TH, the care refresh manager 1285 may determine that a row-hammer attack is occurring or has occurred, and may activate the care refresh control signal CREF. However, monitoring of row-hammer attacks is not limited to the methods described above. It will be appreciated that row-hammer attacks may be identified using various algorithms or detection methods.

An example of the care refresh control circuit 1280*b* is briefly described above. The care refresh control circuit 1280*b* may determine whether to execute the care refresh operation based on the refresh operation status REF_Status and the refresh count SR_CNT at the time the self-refresh exit command SRX is input. This setting may prevent an increase in power consumption due to the care refresh operation when self-refresh entry commands SRE and self-refresh exit commands SRX occur frequently.

Figure 9:
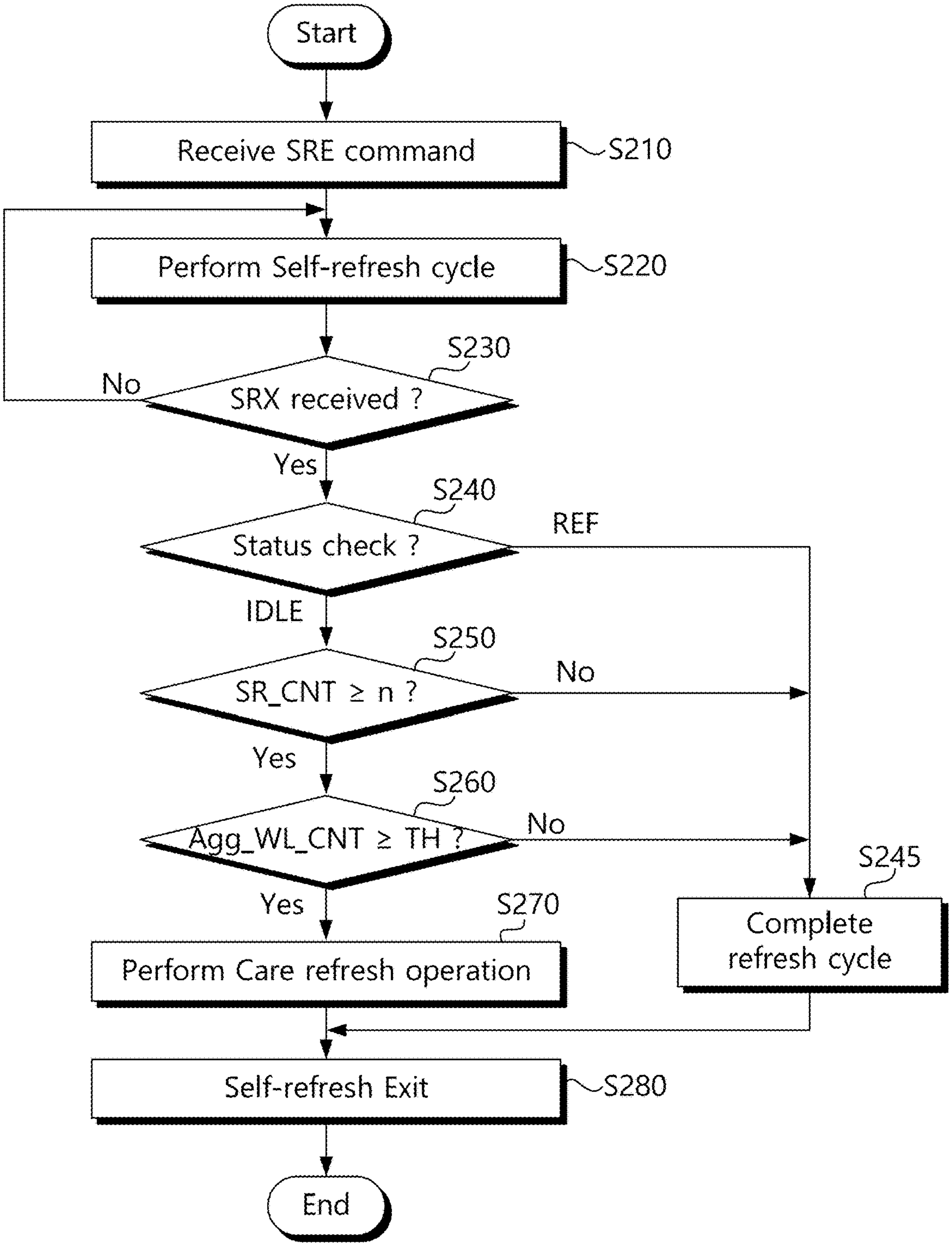
FIG. 9 is a flowchart showing the care refresh operation of the care refresh control circuit of FIG. 8, according to an embodiment.

FIG. 9 is a flowchart showing the care refresh operation of the care refresh control circuit of FIG. 8. Referring to FIG. 8 and FIG. 9, after receiving the self-refresh entry command SRE, the care refresh control circuit 1280*b* and the refresh controller 1250 may monitor a self-refresh exit command SRX, a refresh operation status REF_Status, and a refresh count SR_CNT or count flag CNT flag. And then, the care refresh control circuit 1280*b* determines whether to execute a care refresh operation for row-hammer care according to the monitoring result.

At operation S210, the care refresh control circuit 1280*b* may receive a self-refresh entry command SRE provided from the outside. The self-refresh entry command SRE may be decoded by the command decoder 1230 (as shown for example in FIG. 2) and provided to the care refresh control circuit 1280*b*.

At operation S220, the care refresh control circuit 1280*b* and the refresh controller 1250 may start a self-refresh cycle according to the self-refresh entry command SRE. As described in FIG. 4, the self-refresh cycle may include a refresh period tREF and an idle period tIDLE. The self-refresh cycle may be repeated for every selected row unit.

At operation S230, the care refresh control circuit 1280*b* may detect whether a self-refresh exit command SRX is received. If reception of the self-refresh exit command SRX is detected ("Yes" at operation S230), the procedure may proceed to operation S240. However, if the self-refresh exit command SRX is not detected ("No" at operation S230), the procedure may proceed to operation S220 and execution of the self-refresh cycle continues.

At operation S240, the care refresh control circuit 1280*b* may check the refresh operation status REF_Status at the time the self-refresh exit command SRX is received. If the refresh operation status REF_Status indicates the refresh status REF ("REF" at operation S240), the procedure may proceed to operation S245. On the other hand, if the refresh operation status REF_Status indicates the idle state IDLE ("IDLE" at operation S240), the procedure may proceed to operation S250.

At operation S245, the care refresh control circuit 1280*b* may complete the refresh operation in progress at the time the self-refresh exit command SRX is received. For example, the care refresh control circuit 1280*b* may skip the care refresh operation by deactivating the care refresh control signal CREF. According to embodiments, the refresh operation status REF_Status of the memory device 1200 may continue to the idle state IDLE when the refresh state REF ends. Then, when the refresh escape time tXSR elapses, the procedure moves to step S280, where the self-refresh cycle ends and another command (e.g., Any CMD) is received.

At operation S250, the self-refresh counter 1282 (as shown for example in FIG. 8) of the care refresh control circuit 1280*b* determine the refresh count SR_CNT indicating the number of self-refresh entry commands SRE which have been consecutively received. The self-refresh counter 1282 may count the number of self-refresh entry commands SREs to perform one self-refresh command. The self-refresh counter 1282 may output an operation branch or a count flag CNT flag depending on whether the refresh count SR_CNT reaches the reference value "n". If it is determined that the refresh count SR_CNT has reached the reference value "n" ("Yes" at operation S250), the procedure may proceed to operation S260. However, if it is determined that the refresh count SR_CNT is less than the reference value "n" ("No" at operation S250), the procedure may proceed to operation S245.

At operation S260, the care refresh control circuit 1280*b* may check for the occurrence of a row-hammer attack. For example, the aggressor word line counter 1286 of the care refresh manager 1285 may check whether the aggressor word line count AGG_WL_CNT has reached the threshold TH. If the aggressor word line count AGG_WL_CNT is less than the threshold TH ("No" at operation S260), the procedure may proceed to operation S245. However, if the aggressor word line count AGG_WL_CNT is greater than or equal to the threshold TH ("Yes" at operation S260), the procedure moves to step S270.

At operation S270, the care refresh control circuit 1280*b* may activate the care refresh control signal CREF. Then, the refresh controller 1250 may execute a care refresh operation in response to the care refresh control signal CREF. According to the care refresh operation, refresh may occur for the victim cells of the row-hammer attack. The care refresh operation may be completed within the idle period tIDLE.

At operation S280, the care refresh control circuit 1280*b* may end the self-refresh operation requested through the self-refresh entry command SRE. Then, other waiting commands may be input.

Examples of the functions of the care refresh control circuit 1280*b* and the refresh controller 1250 according to embodiments are briefly described above. According to embodiments, the care refresh control circuit 1280*b* may determine whether to execute the care refresh operation according to the refresh operation status REF_Status and the refresh count SR_CNT at the time the self-refresh exit command SRX is input. This setting may prevent an increase in power consumption due to the care refresh operation that occurs when frequent self-refresh entry commands SRE and self-refresh exit commands SRX are input.

Figure 10:
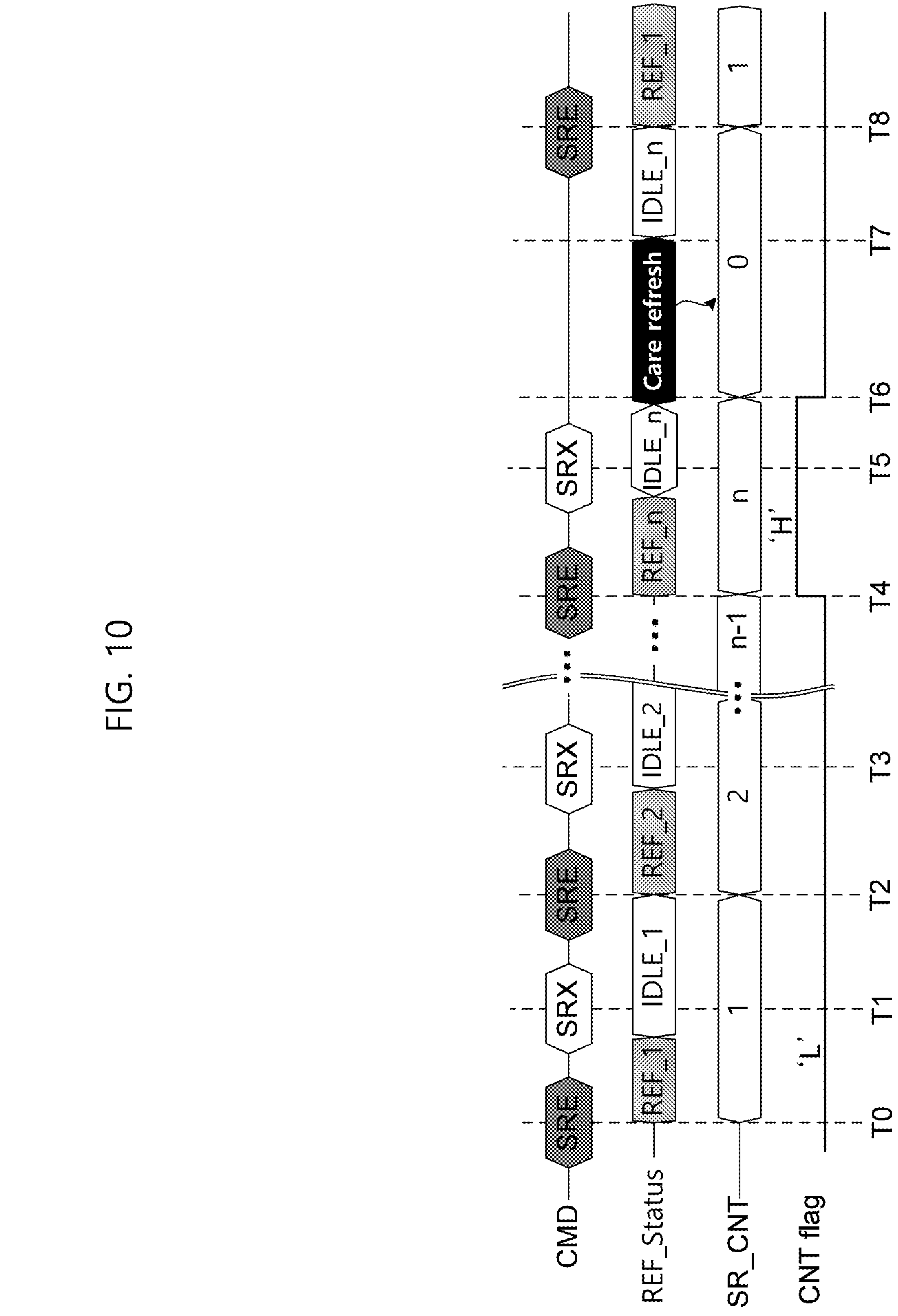
FIG. 10 is a timing diagram showing an example of the care refresh operation of FIG. 9, according to an embodiment.

FIG. 10 is a timing diagram showing an example of the care refresh operation of FIG. 9. Referring to FIG. 9 and FIG. 10, when the time point at which the self-refresh exit command SRX is received corresponds to the idle state IDLE, a care refresh operation may be executed or skipped according to the refresh count SR_CNT or the count flag CNT flag.

At T0, a self-refresh entry command SRE may be input to the memory device 1200. Then, the refresh controller 1250 and the care refresh control circuit 1280*b* may start a self-refresh cycle. The refresh controller 1250 may execute the first refresh operation REF_1 for the selected row. Then, the refresh controller 1250 may set the selected row to the idle state IDLE_1. In addition, the status monitor 1281 increment the refresh count SR_CNT from "0" to "1". However, because the refresh count SR_CNT does not reach the reference value "n", the count flag CNT flag may maintain the low level "L".

At T1, a self-refresh exit command SRX may be received. The self-refresh exit command SRX may be received when the status flag is in the idle state IDLE_1. However, the care refresh control circuit 1280*b* may skip the care refresh operation because the count flag CNT flag is at the low level "L".

At T2, a self-refresh entry command SRE may be input to the memory device 1200. In response to the input of the self-refresh entry command SRE, the refresh controller 1250 and the care refresh control circuit 1280*b* may start the self-refresh cycle (REF_1, IDLE_1) at T2. In addition, the status monitor 1281 may increment the refresh count SR_CNT from "1" to "2". However, because the refresh count SR_CNT still does not reach the reference value "n", the count flag CNT flag may maintain the low level "L".

At T3, a self-refresh exit command SRX may be received. The self-refresh exit command SRX may be received when the status flag is in the idle state IDLE_2. However, because the count flag CNT flag is at low level "L", the care refresh control circuit 1280*b* may skip the care refresh operation in this cycle as well.

As described above, frequent self-refresh entry command SRE and self-refresh exit command SRX pairs may continuously occur. And the self-refresh exit command SRX may be input when the status flag is in the idle state IDLE_k. However, because the refresh count SR_CNT has not reached the reference value "n", the count flag CNT flag may maintain the low level "L". Therefore, even if the self-refresh exit command SRX is input to the idle state IDLE_k of the status flag, the care refresh operation will be skipped.

At T4, a self-refresh entry command SRE may be input to the memory device 1200. In response to the input of the self-refresh entry command SRE, the refresh controller 1250 and the care refresh control circuit 1280*b* may start the self-refresh cycle (REF_4, IDLE_4) at T4. In addition, the status monitor 1281 may increment the refresh count SR_CNT from "n-1" to "n". This time, the refresh count SR_CNT has reached the reference value "n". Accordingly, the count flag CNT flag may transition to the high level "H" at T4.

A self-refresh exit command SRX may be received at T5 when the count flag CNT flag is in the high level state. The self-refresh exit command SRX may be received in the high state "H" of the count flag CNT flag and the idle state IDLE_n of the status flag. Accordingly, the care refresh control circuit 1280*b* may perform the care refresh operation in this refresh cycle. For example, the care refresh operation may be executed at T6 and end at T7. In addition, according to the execution of the care refresh operation, the status monitor 1281 may initialize the refresh count SR_CNT to "0" to "1".

At T8, another self-refresh entry command SRE may be input to the memory device 1200. In response to the input of the self-refresh entry command SRE, the refresh controller 1250 and the care refresh control circuit 1280*b* may start the self-refresh cycle (REF_1, etc.) at T8. In addition, the status monitor 1281 may increment the refresh count SR_CNT from "0" to "1".

As described above, the operating method of the care refresh control circuit 1280*b* according to embodiments was briefly explained using a timing diagram. The care refresh control circuit 1280*b* may determine whether to execute the care refresh operation based on the refresh operation status REF_Status and the refresh count SR_CNT at the time the self-refresh exit command SRX is input. This setting may reduce the number of care refresh operations that occur when frequent self-refresh entry commands SRE and self-refresh exit commands SRX are input. Accordingly, power consumption of the memory device 1200 due to frequent care refresh operations may be prevented.

Figure 11:
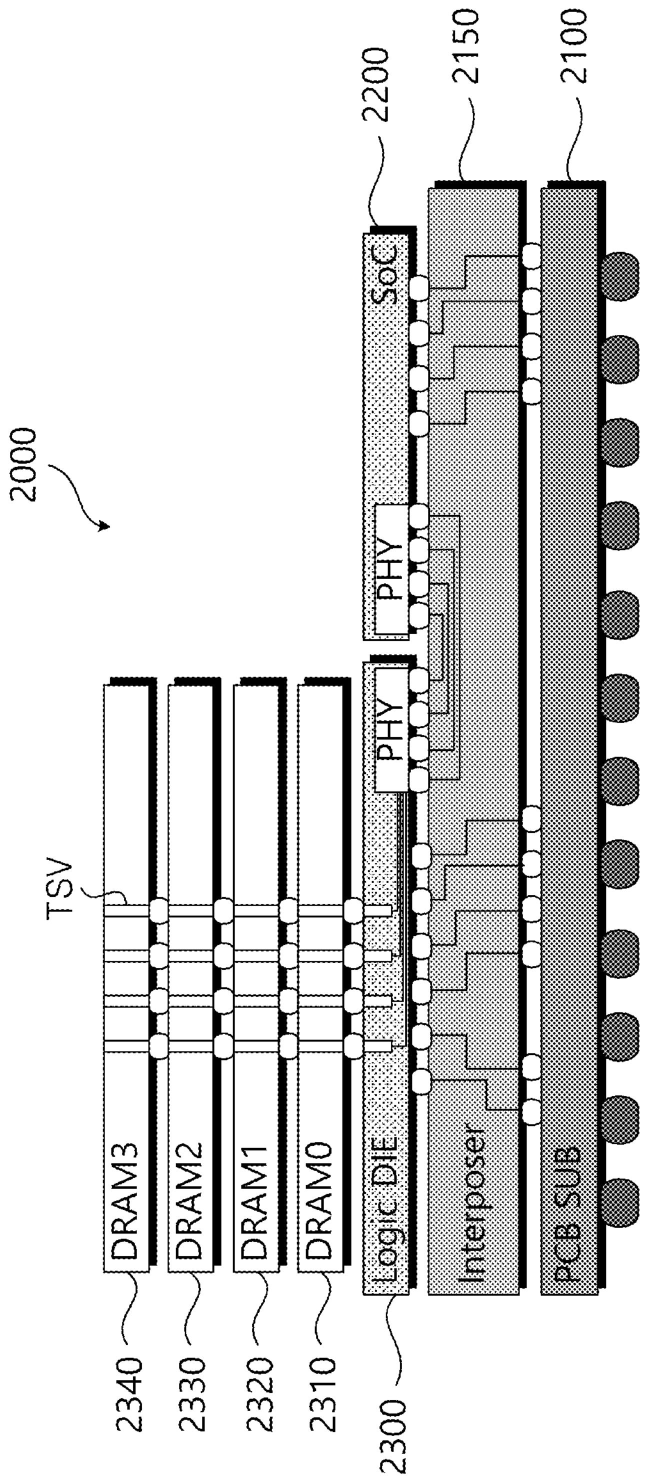
FIG. 11 is a cross-sectional view showing a memory system according to an embodiment.

FIG. 11 is a cross-sectional view showing a memory system according to an embodiment. Referring to FIG. 11, a memory system 2000 implemented as a stacked memory may include a PCB substrate 2100, an interposer 2150, a host die 2200, a logic die 2300, and high-bandwidth DRAMs 2310, 2320, 2330 and 2340.

The memory system 2000 may connect the high-bandwidth DRAMs 2310, 2320, 2330, and 2340 and the host die 2200 using an interposer 2150. The interposer 2150 may be disposed on the upper part of the PCB substrate 2100 and may be electrically connected to the PCB substrate 2100 through flip chip bumps FB.

A host die 2200, a logic die 2300, and high-bandwidth DRAMs 2310, 2320, 2330, and 2340 in a stacked structure may be disposed on the interposer 2150. To implement the memory system 2000, TSV lines may be formed in the plurality of high-bandwidth DRAMs 2310, 2320, 2330, and 2340. The TSV lines may be electrically connected to micro bumps MBs formed between the plurality of high-bandwidth DRAMs 2310, 2320, 2330, and 2340.

Here, the plurality of high-bandwidth DRAMs 2310, 2320, 2330, and 2340 may determine whether to execute a care refresh operation according to the refresh operation status REF_Status in response to the self-refresh exit command SRX. If a self-refresh exit command SRX is received in the idle state IDLE of the self-refresh cycle, a care refresh operation for row-hammer care may be performed before the self-refresh exit period tXSR expires. Because the self-refresh exit period tXSR may be guaranteed in each of the high-bandwidth DRAMs 2310, 2320, 2330, and 2340, care refresh may be sufficiently performed within the self-refresh exit period tXSR after the self-refresh exit command SRX is received. Accordingly, each of the plurality of high-bandwidth DRAMs 2310, 2320, 2330, and 2340 may perform the care refresh operation without adding a separate sequence. Accordingly, the care refresh operation for row-hammer care of each of the plurality of high-bandwidth DRAMs 2310, 2320, 2330, and 2340 may be possible without performance degradation or increase in power consumption due to the refresh operation.

The examples described above relate to some embodiments of the present disclosure. In addition to the above-described embodiments, embodiments of the present disclosure may include simple design changes or easily changeable embodiments. In addition, embodiments of the present disclosure will include techniques that may be easily modified and implemented. Therefore, the scope of the present disclosure should not be limited to the above-described embodiments, and should be defined by the claims and equivalents of the appended claims.

What is claimed is:

1. A self-refresh method of a semiconductor memory device, comprising:

receiving a self-refresh entry command;

performing a self-refresh cycle based on the self-refresh entry command;

receiving a self-refresh exit command;

based on receiving the self-refresh exit command, determining a refresh operation status; and based on determining that the refresh operation status indicates an idle state, executing a care refresh operation corresponding to row-hammer care.

2. The method of claim 1, further comprising:

skipping the care refresh operation based on determining that the refresh operation status indicates a refresh state in which at least one of an active operation, a restore operation, and a precharge operation for the selected memory cell is activated.

3. The method of claim 1, further comprising:

detecting a row-hammer attack on the semiconductor memory device.

4. The method of claim 3, wherein the care refresh operation is executed based on the row-hammer attack being detected and determining that the refresh operation status indicates the idle state.

5. The method of claim 4, wherein the detecting the row-hammer attack comprises:

counting a number of accesses to an aggressor word line; and based on the counted number of accesses reaching a threshold, determining that the row-hammer attack has occurred.

6. The method of claim 1, further comprising, based on determining that the refresh operation status indicates the idle state, determining whether a row-hammer attack is detected, wherein the care refresh operation is skipped based on the row-hammer attack being not detected and determining that the refresh operation status indicates the idle state.

7. The method of claim 1, further comprising:

based on a plurality of self-refresh entry commands being received, counting a number of consecutive self-refresh entry commands.

8. The method of claim 7, wherein based on the number of consecutive self-refresh entry commands being less than a reference value, the care refresh operation is skipped.

9. The method of claim 8, wherein the care refresh operation is performed based on the number of consecutive self-refresh entry commands being greater than or equal to the reference value.

10. A semiconductor memory device, comprising:

a cell array comprising a plurality of dynamic random access memory (DRAM) cells;

a command decoder configured to decode commands received by the semiconductor memory device and to generate a self-refresh entry command and a self-refresh exit command;

a care refresh control circuit configured to generate a care refresh control signal for performing a care refresh operation on victim cells based on the self-refresh entry command, the self-refresh exit command corresponding to selected memory cells, and a refresh operation status; and a refresh controller configured to perform a self-refresh operation on the selected memory cells and the care refresh operation on the victim cells based on receiving the care refresh control signal, wherein the care refresh control circuit is further configured to generate the care refresh control signal based on determining that the refresh operation status indicates an idle state, and to skip the care refresh operation based on determining that the refresh operation status indicates a refresh state.

11. The device of claim 10, wherein the care refresh control circuit comprises:

a status monitor configured to monitor the refresh operation status and generate a status flag;

a command generator configured to generate a care refresh command according to the self-refresh entry command, the self-refresh exit command, and the status flag; and a care refresh manager configured to generate the care refresh control signal based on whether the care refresh command is activated.

12. The device of claim 11, further comprising:

an aggressor word line counter configured to activate the care refresh control signal based on a number of accesses to an aggressor word line.

13. The device of claim 11, wherein the status monitor is further configured to determine the refresh operation status using at least one of an active signal, a restore signal, and a precharge signal corresponding to the selected memory cells.

14. The device of claim 10, wherein the care refresh control circuit comprises:

a status monitor configured to monitor the refresh operation status and generate a status flag;

a self-refresh counter configured to, based on plurality of self-refresh commands being received, count a number of consecutive self-refresh entry commands and generate a count flag;

a command generator configured to generate a care refresh command based on the self-refresh entry command, the self-refresh exit command, the status flag, and the count flag; and a care refresh manager configured to generate the care refresh control signal based on whether the care refresh command is activated.

15. The device of claim 14, wherein the self-refresh counter is further configured to activate the count flag based on the number of the consecutive self-refresh entry commands being greater than or equal to a reference value.

16. A self-refresh method of a semiconductor memory device, comprising:

performing a self-refresh cycle comprising a refresh state and an idle state as refresh operation status for the selected memory cells;

receiving a self-refresh exit command;

based on receiving the self-refresh exit command, determining a current refresh operation status; and executing a care refresh operation for row-hammer care based on the current refresh operation status.

17. The method of claim 16, further comprising, based on determining that the current refresh operation status indicates the refresh state, skipping the care refresh operation.

18. The method of claim 17, wherein the care refresh operation is executed based on determining that the current refresh operation status indicates the idle state.

19. The method of claim 16, further comprising:

detecting a row-hammer attack on the semiconductor memory device, wherein the care refresh operation is performed based on the row-hammer attack being detected and determining that the refresh operation status indicates the idle state.

20. The method of claim 19, further comprising:

receiving a plurality of self-refresh entry commands; and based on receiving the plurality of self-refresh entry commands, counting a number of consecutive self-refresh entry commands, wherein based on the number of consecutive self-refresh entry commands being less than a reference value, the care refresh operation is skipped.

* * * * *